United States Patent Office 3,147,116

Patented Sept. 1, 1964

3,147,116

PRINTING PLATES COMPRISING HYDROPHOBIC RESISTO FORMED BY CROSSLINKING PHOTOPOLYMERIZED HYDROPHILIC MONOMERS WITH AN ISOCYANATE

Curt B. Roth, Glenview, Ill., assignor to General Aniline & Film Corporation, New York, N.Y., a corporation of Delaware No Drawing. Filed Nov. 28, 1961, Ser. No. 155,892
6 Claims. (Cl. 96—35)

This invention relates generally to printing plates and, more particularly, to a process for the production of negative working printing plates by the conversion of a hydrophilic printing plate surface into a hydrophobic surface.

It is well recognized in the art that there are many advantages in using the offset printing method over other reproduction processes. The offset printing method allows for the preparation of a great number of copies of outstanding quality and of a high degree of permanence. On the other hand, although other reproduction processes e.g. the diazotype process is limited in the number of copies which can be made from a printing master and are not acceptable as providing copies of a high degree permanence, nevertheless said processes offer economic advantages over the offset printing method which makes them extremely popular, especially for the vast amount of duplication required in modern business practice.

The economic disadvantages of the offset printing processes stem from the fact that heretofore complex and expensive photographic equipment had to be employed to prepare the printing plates used in said processes. The cost involved did not economically justify the use of these processes for the usual business reproductions since business concerns were willing to accept the non-permanent copies for the economic advantages.

Therefore, it is the object of this invention to provide a process for the preparation of photomechanical printing plates capable of printing copies of outstanding quality and of a high degree of permanence.

It is another object of this invention to provide a process for the preparation of negative working photomechanical printing plates by the conversion of a hydrophilic printing plate surface into a hydrophobic (and therefore lipophilic) surface.

It is yet another object of this invention to provide a process for the preparation of printing plates, said process being efficient, economical, easy to operate and capable of yielding high quality prints.

It has now been discovered that if a printing surface prepared from the imagewise photopolymerization of an ethylenically unsaturated monomer containing a hydroxyl group is caused to react with an isocyanate, a printing plate will result which can be employed in an offset printing process.

The production of images by the photopolymerization of monomers through an image bearing transparency is well known in the art. A monomer containing the $CH_2=C=$ group or mixtures thereof, together with a light sensitive initiator and coating additions like gelatin, gelatin substitutes i.e. polyvinyl alcohol, wetting agents i.e. lauryl sulfate, and the like is subjected to an imagewise exposure to light. The areas upon which the light has impinged become polymerized. The unexposed, unpolymerized areas are removed by washing so as to obtain a negative resist.

The resists which are obtained by the above-described photopolymerization process are usually hydrophilic and therefore non-ink receptive. In other words, said resists could not be used to provide negative working plates, much less negative working plates capable of being used in offset printing processes.

As has previously been pointed out, this invention relates to the conversion of the hydrophilic resists which result from the photopolymerization of ethylenically unsaturated monomers containing a hydroxyl group, into hydrophobic photomechanical plates. These hydroxyl containing monomers and their resulting polymers are well known in the art and this invention is not dependent upon any specific polymer falling with in the above definition. Thus, by the process of the instant invention it is possible to convert the polymer resulting from polymerization of the aforesaid monomer, or mixtures thereof into hydrophobic printing surfaces.

Examples of the polymers which can be converted by the novel process of the instant invention include poly N-methylol acrylamide, a copolymer of N,N′-methylenebisacrylamide and N-methylol acrylamide, polyoxy alkylene glyocls, polysaccharides, polyepoxides, etc. The preferred polymer is a copolymer of N-methylol arcylamide and N,N′-methylenebisacrylamide.

The conversion of the hydrophilic resist into a hydrophobic printing surface is effected by reacting the resist with an aromatic isocyanate or mixtures of aromatic isocyanates. The isocyanates which can be employed correspond to the formula $$R(NCO)_m$$

wherein R represents aryl or aralkyl which can be ring substituted with a variety of substituents including methyl, ethyl, propyl, chlorine, bromine, chloroalkyl, and $m$ represents 1 or 2. It is pointed out that the nature and number of substituents on the ring is not critical. Specific isocyanates encompassed by the above fomula include phenyl isocyanate, benzyl isocyanate, vinylphenyl isocyanate, phenyl - meta - diisocyanate, benzyl-meta-diisocyanate, toluene diisocyanate, chlorophenyl isocyanate, etc.

While not wishing to be bound by a theory of operation, it would appear that the hydrophobic properties of the printing plates of this invention are the result of the introduction of an aryl ring onto the polymer resist being treated. The following reaction scheme will illustrate the reaction between an aromatic mono-isocyanate and a hydroxyl containing polymer.

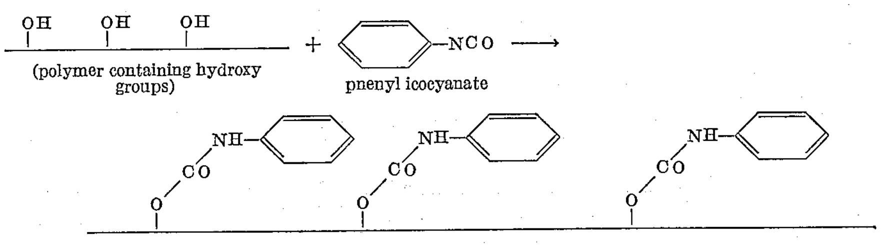

The resulting polymer is now hydrophobic due to the reaction of the isocyanate with the hydroxy groups of the hydrophilic polymeric resist.

As has been previously pointed out, the conversion of the hydrophilic resist to a hydrophobic surface occurs by treating said hydrophilic resist with a mono- or diisocyanate. The reaction of such a surface with an aromatic diisocyanate can be represented by the following reaction scheme:

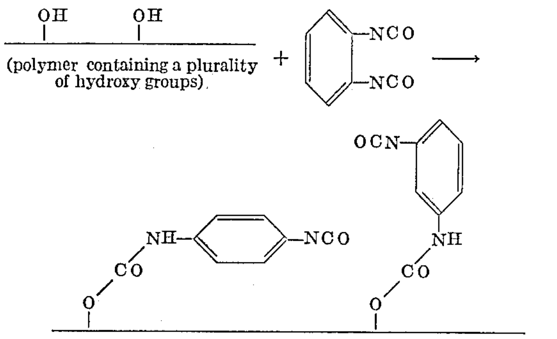

The resulting polycarbamate is hydrophobic and therefore lipophilic. It has been discovered, however, that the hydrophobic properties of polycarbamates can be increased by further treatment with water. The water causes crosslinking of the polycarbamate so as to produce a polymer of greater strength and increased hydrophobic properties.

The reaction of water with a polycarbamate can be illustrated by the following scheme:

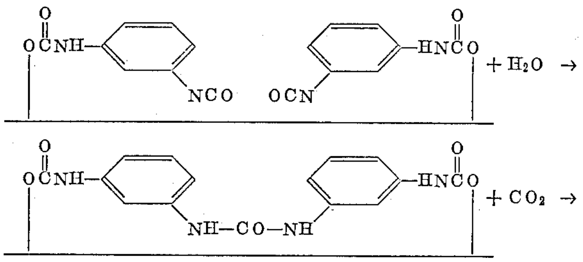

From the above reaction scheme it can be seen that water causes two isocyanate groups to react by crosslinking with the elimination of carbon dioxide so as to produce a polymer of greater strength. It is obvious that the increased strength enhances its use as a printing plate.

The method of contacting the hydrophilic resist with the aromatic isocyanate is far from being critical and can be accomplished in a variety of ways. Thus, the hydrophilic surface can be drawn through a bath containing the isocyanate while the bath is maintained at the reflux temperature of the particular isocyanate used. Additionally, the printing surface and the isocyanate can be placed in a suitable container, such as a beaker, covered and heated to reflux temperature, etc.

The period of time during which the hydrophilic resist and the isocyanate are reacted is not narrowly critical and can vary over a wide range. However, it has been found that two minutes to two hours is usually adequate.

It is also to be pointed out that it is possible to add the isocyanate in an inert diluent with or without a weak base, although this is not necessary. Any solvent, such as benzene, which is inert under the reaction conditions is operable. An example of a weak base which can be added to the diluent is pyridine.

The following example will illustrate the process of this invention:

A light sensitive coating was prepared of the following composition:

| | | |
|---|---|---|
| 10% aqueous gelatin | mil | .35 |
| 8% aqueous saponin | mil | 0.5 |
| Silver chloride emulsion | grams | 5 |
| 180 grams N-methylol acrylamide, 7.2 grams N,N'-methylenebisacrylamide, 120 ml. water | mil | 10 |

The above light sensitive coating was placed on an aluminum support and exposed to light through an image-bearing transparency for about one minute. After exposure, the plate was placed under a faucet and rinsed with 40° C. tap water until the aluminum metal was visible in the unexposed areas. This procedure yielded a hydrophilic printing plate surface.

This hydrophilic printing plate was placed in a 4 liter beaker containing 10 milliliters of phenyl isocyanate. The beaker was covered with a glass plate and heated to reflux for periods of from 2 to 120 minutes.

The resulting negative-working printing plate had a hydrophobic surface as a result of the reaction with the isocyanate.

This plate was placed into a conventional offset printing press and prints were made. The prints were of high quality and the press never had to be stopped because of plate failure. The press was never run to the exhaustion of the plate but stopped after about 400 copies.

The numerous variations which can follow from the instant invention will appear obvious to one skilled in the art and it is not intended that this invention be limited except as necessitated by the appended claims.

What is claimed is:

1. The process of producing a negative working metal lithographic plate having on one surface ink-receptive polymeric printing portions and water-receptive, non-printing portions defined by the metal of said surface which comprises coating a metal base with a photopolymerizable composition of a colloidal carrier having dispersed therein an ethyenically unsaturated monomer having a $CH_2=C<$ group and containing a hydroxyl group, said monomer being capable of yielding on polymerization a hydrophilic polymer containing hydroxyl groups, irradiating said composition with actinic light underneath a pattern to polymerize said monomer in the exposed areas to said hydrophilic polymer, selectively washing out the unexposed areas until the metal surface of said plate is visible to form in said areas said water-receptive non-printing portions and reacting said hydrophilic polymer in the exposed areas with an isocyanate of the formula $R(NCO)_m$ wherein R is selected from the class consisting of aryl and aralykyl and $m$ is a whole number not greater than 2, until said polymer is converted into said ink-receptive polymeric printing portions.

2. The process as defined in claim 1 wherein the ethylenically unsaturated monomer is N-methylol acrylamide.

3. The process as defined in claim 1 wherein said photopolymerizable composition comprises gelatin having N-methylol acrylamide and N,N'-methylene-bis-acrylamide dispersed therein.

4. The process as defined in claim 1 wherein the isocyanate is phenyl isocyanate.

5. The process as defined in claim 1 wherein the isocyanate is phenyl-meta-diisocyanate.

6. The process as defined in claim 1 wherein the photopolymerizable composition comprises gelatin, silver chloride, N-methylol-acrylamide, N,N'-methylene-bis-acrylamide and the isocyanate is a phenyl isocyanate.

References Cited in the file of this patent

UNITED STATES PATENTS

| | | |
|---|---|---|
| 2,830,899 | Brown | Apr. 15, 1958 |
| 2,861,058 | Unruh et al. | Nov. 18, 1958 |
| 2,902,365 | Martin | Sept. 1, 1959 |
| 2,948,706 | Schellenberg et al. | Aug. 9, 1960 |
| 2,952,536 | Kurz | Sept. 13, 1960 |

FOREIGN PATENTS

| | | |
|---|---|---|
| 590,766 | Belgium | May 31, 1960 |
| 1,085,423 | Germany | July 14, 1960 |